(12) United States Patent
Rai et al.

(10) Patent No.: US 7,910,217 B2
(45) Date of Patent: Mar. 22, 2011

(54) WEAR RESISTANT COATINGS FOR RACE LAND REGIONS OF BEARING MATERIALS

(75) Inventors: Amarendra K. Rai, Beavercreek, OH (US); Rabi Bhattacharya, Beavercreek, OH (US); Hitesh K. Trivedi, Fairborn, OH (US)

(73) Assignee: UES, Inc., Dayton, OH (US)

( * ) Notice: Subject to any disclaimer, the term of this patent is extended or adjusted under 35 U.S.C. 154(b) by 594 days.

(21) Appl. No.: 11/935,461

(22) Filed: Nov. 6, 2007

(65) Prior Publication Data
US 2008/0107917 A1 May 8, 2008

Related U.S. Application Data

(60) Provisional application No. 60/864,629, filed on Nov. 7, 2006.

(51) Int. Cl.
*B32B 9/00* (2006.01)
(52) U.S. Cl. .......................... 428/457; 428/469; 428/698
(58) Field of Classification Search .................. None
See application file for complete search history.

(56) References Cited

U.S. PATENT DOCUMENTS

| | | | | |
|---|---|---|---|---|
| 4,252,862 A | * | 2/1981 | Nishida | 428/627 |
| 4,680,438 A | * | 7/1987 | Witting et al. | 200/268 |
| 5,165,804 A | | 11/1992 | Fisher et al. | |
| 5,553,949 A | | 9/1996 | Fukuwaka | |
| 5,700,094 A | | 12/1997 | Dam et al. | |
| 6,502,991 B2 | | 1/2003 | Knepper et al. | |
| 6,764,219 B2 | | 7/2004 | Doll et al. | |
| 6,945,699 B2 | | 9/2005 | Tibbits | |
| 6,966,954 B2 | | 11/2005 | Rhoades et al. | |
| 7,178,986 B2 | | 2/2007 | Ohtsuki et al. | |
| 2003/0185478 A1 | | 10/2003 | Doll et al. | |

* cited by examiner

*Primary Examiner* — Timothy Speer
(74) *Attorney, Agent, or Firm* — Dinsmore & Shohl LLP

(57) ABSTRACT

Embodiments of a coated substrate (for example, a coated race land region of a roller bearing element) comprise a metallic substrate, a ceramic underlayer comprising a nitride, a carbide, a carbonitride, a boride, or combinations thereof disposed over the metallic substrate, and a mixed layer comprising titanium nitride and silver disposed over the ceramic underlayer; and an overlayer disposed over the mixed layer.

19 Claims, 4 Drawing Sheets

WEAR RESISTANT COATINGS FOR RACE LAND REGIONS OF BEARING MATERIALS

CROSS-REFERENCE TO RELATED APPLICATIONS

This application claims the benefit of U.S. Provisional Application Ser. No. 60/864,629, filed Nov. 7, 2006.

TECHNICAL FIELD

Embodiments of the present invention generally relate to wear resistant coatings and specifically relate to wear-resistant coatings applied to the race-land region of a rolling element bearing.

SUMMARY

Rolling element bearings, for example, bearings which are used at high speeds and heavy loads, are utilized in various industrial applications. Rolling element bearings are effective in reducing the friction between a rotating shaft and a fixed journal, or between a rotating wheel and a fixed axle, is amply demonstrated by the widespread usage of such bearings in an enormous variety of applications. Such bearings are sometimes identified as antifriction bearings because there is generally far less friction associated with the rolling action between the rolling elements and the inner and outer races than with the sliding action between a shaft and journal in a journal bearing. Rolling element bearings vary in size, rotational speed, operating load and temperature, and type of rolling element. The most widely used types of rolling elements in such bearings are balls, cylindrical rollers and frustoconical tapered rollers.

Rolling element bearings typically include a spacer means, usually called a cage, separator or retainer, which serves to space the rolling elements from each other uniformly around the periphery of the races. For some bearings designed to operate at high values of DN, the cage is guided by having it operate in close proximity to land or shoulder regions on either the inner race or the outer race. For additional structural details regarding roller element bearings, U.S. Pat. No. 5,165,804 has been incorporated herein by reference in its entirety.

As mentioned above, rolling element bearings may be used in various industrial applications. For example, rotating compressor and turbine components of aircraft gas turbine engines may utilize rolling element bearings. Advanced gas turbine engine bearings for fighter aircraft and the Versatile Affordable advanced Turbine Engines (VATTE) programs will experience increased DN (bearing bore in millimeters times bearing speed in revolution per minute), increased load and high temperature resulting in boundary lubrication, increased metal to metal contact and increased wear and corrosion. The present inventors have recognized that bearings using commercial alloys such as M50, M50-Nil and 440C are not adequate for such operating conditions.

Alternatively, current advanced gas turbine engine bearings may also utilize stainless steel materials such as Pyrowear 675, CSS-42L etc. These materials define a case/core structure having two sets of properties: one set for the surface (case) property and one set for the core. The specific surface properties are higher hardness, corrosion resistance, rolling contact fatigue resistance, and wear resistance. The specific core properties are fracture toughness and strength. In these materials, increased surface hardness is provided by carburization of the surface layer.

Based on experimentation and testing, the present inventors recognized that materials such as Pyrowear 675 experience wear especially shoulder wear. This illustrates the need for improving the wear resistance of bearing materials, for example, Pyrowear 675. For high speed, load and temperature applications, surface modification of the bearing materials, are needed to reduce wear.

The application of hard coatings to rolling elements and both races as a means of reducing wear has been suggested. However, it has been discovered that hard coatings on the rolling elements or the races may be detrimental to the operation of heavily loaded high speed bearings. Under such conditions, the hard coatings may crack or spall off, producing loose particles of the hard materials that in turn may act as contaminant particles.

To combat these issues, the present invention utilizes the application of a TiN—Ag nanocomposite coating, which may be applied to the race-land region of a rolling element bearing for preventing wear or scoring of the race land region, while facilitating operation at increased DN (bearing bore in millimeters times bearing speed in revolution per minute), increased load and high temperature.

According to one embodiment, a coated substrate is provided. The coated substrate comprises a metallic substrate, a metal underlayer comprising a nitride, a carbide, a carbonitride, a boride, or combinations thereof disposed over the metallic substrate, and a mixed layer comprising titanium nitride and silver disposed over the metal underlayer, and an overlayer disposed over the mixed layer. As used herein, "over" may mean directly above another layer, or may mean above another layer with intervening layers therebetween.

According to a further embodiment, another coated substrate is provided. The coated substrate comprises a stainless steel substrate, a titanium nitride underlayer disposed over the stainless steel substrate, a mixed layer comprising titanium nitride and silver disposed over the metal underlayer, and a silver overlayer disposed over the mixed layer.

In accordance with yet another embodiment, a method of coating a substrate is provided. The method comprises the steps of providing a metallic substrate, heating the metallic substrate to a temperature between about 250 to about 400° C., depositing a metal underlayer comprising a nitride, a carbide, a carbonitride, a boride layer or combinations over the metallic substrate, and depositing a mixed layer comprising titanium nitride and silver over the metal underlayer, and depositing an overlayer over the mixed layer.

These and additional objects and advantages provided by the embodiments of the present invention will be more fully understood in view of the following detailed description, in conjunction with the drawings.

BRIEF DESCRIPTION OF THE DRAWINGS

The following detailed description of specific embodiments of the present invention can be best understood when read in conjunction with the drawings enclosed herewith. The drawing sheets include.

Figure 1:
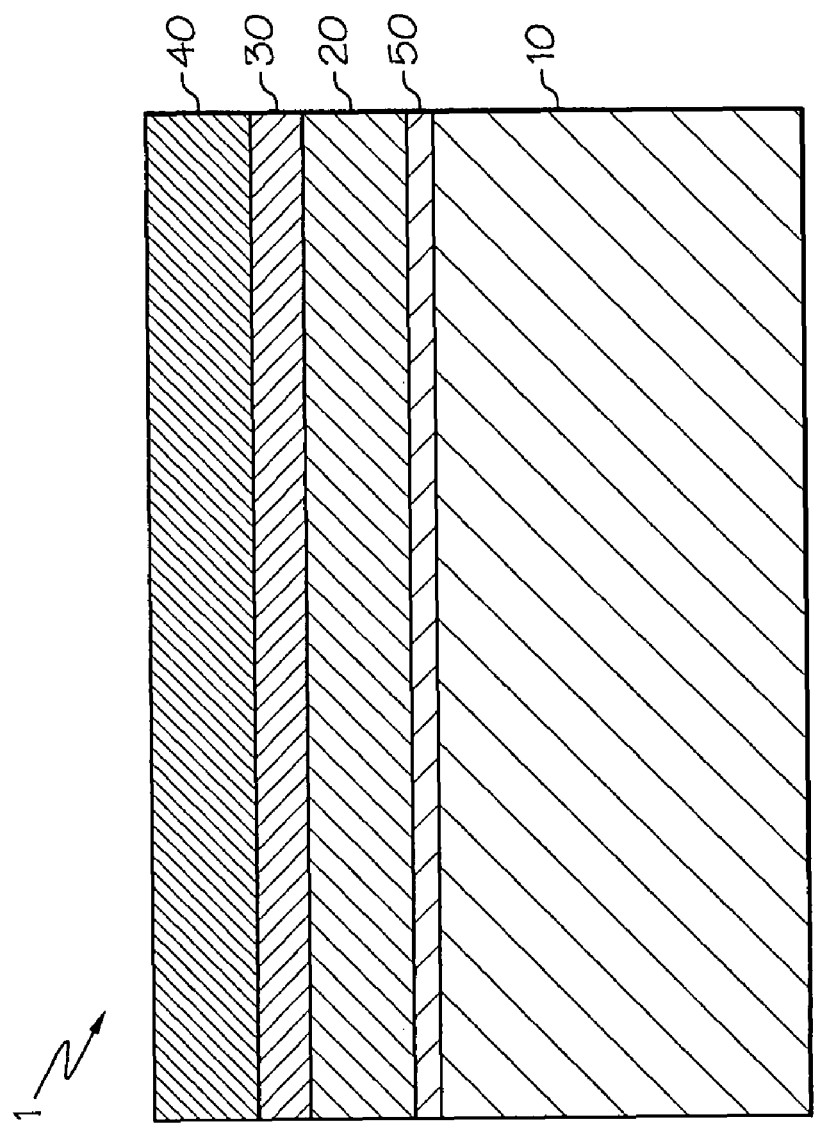
FIG. 1 is a schematic illustration of a coated substrate according to one or more embodiments of the present invention.

The embodiments set forth in the drawings are illustrative in nature and not intended to be limiting of the invention defined by the claims. Moreover, individual features of the drawings and the invention will be more fully apparent and understood in view of the detailed description.

DETAILED DESCRIPTION

The present invention is directed to coatings, and methods of preparing coatings, especially coatings used on race land regions of turbine engine bearings. These coatings are configured to reduce wear and lower friction, and are operable at high ($\geqq$400 C) and low temperatures ($\leqq$200 C).

Although the embodiments of the present invention are specifically directed to coatings on race land regions of roller bearings, it is contemplated that the coatings may be provided on other substrates and substrate surfaces. Referring to the embodiment of FIG. 1, a coated substrate 1 in accordance with the present invention is provided. The coated substrate 1 comprises a metallic substrate 10, for example, a stainless steel substrate, such as Pyrowear 675® produced by Carpenter Technology Corporation or CSS-42L® produced by Latrobe Specialty Steels Co. The coated substrate 1 also comprises a ceramic underlayer 20 disposed over the metallic substrate 10. The ceramic underlayer 20 comprises a nitride, a carbide, a carbonitride, a boride, or combinations thereof. Suitable metals used in the ceramic underlayer include Ti, Cr, Al, Zr, Hf, Nb, V, or combinations thereof. In an exemplary embodiment, the ceramic underlayer 20 comprises titanium nitride.

Furthermore, the coating over the substrate 10 includes a mixed layer 30 disposed over the ceramic underlayer 20. The mixed layer 30 typically comprises titanium nitride and silver; however, other compositional mixtures are contemplated herein. The mixed layer 30 may comprise about 95 to about 99% by wt TiN and 1 to about 5% by wt Ag. In further embodiment, the mixed layer is a composite nanocoating comprising particle sizes of about 10 to about 100 nm. Moreover, the coated substrate 1 may also include an overlayer 40 over the mixed layer 30. The overlayer 40 may comprise Ag, Au, Cu, and C or combinations thereof. In embodiments where the mixed layer comprises TiN/Ag, it may be desirable to use an Ag overlayer 40 thereon to improve bonding and adhesion. Typically, the overlayer 40 is softer than the mixed layer 30. To further improve adhesion, it may also be desirable to use an additional metal layer, for example, a metal layer 50 disposed between the metallic substrate 10 and the metal underlayer 20. In an exemplary embodiment, the metal layer 50 may be about 0.1 to about 0.2 µm thick, the ceramic underlayer 20 may be about 1 to about 3 µm thick, the mixed layer 30 may be about 0.5 to about 1 µm thick, and the Ag over layer 40 may be about 0.5 to about 2 micron thick.

The coated substrate 1 may be produced by various deposition techniques known to one of ordinary skill in the art. For example, deposition may occur via filtered cathodic arc vapor deposition, direct arc vapor deposition or magnetron sputtering. Using vapor deposition technology, the coating layers may be formed by introducing the metallic substrate 1 into a vacuum deposition chamber (e.g. a hermetically sealed vacuum chamber), and heating the metallic substrate in the deposition chamber. In one exemplary embodiment, the metallic substrate 1 may be heated to a temperature of about 250 to about 400° C. At which point, the layers of the coating may be provided stepwise by activating selectively a plurality of cathodic arc discharge sources in communication with the deposition chamber. In this process, cathodes of the material to be coated may include, for example, titanium and titanium-silver composite. The arc current of about 50-100 amp and a substrate bias −40 to −100 V may be employed during coating deposition. Moreover, a nitrogen gas pressure 5×10-2 to 2×10-1 Pa can be used.

In particular, a composite coating of titanium nitride and silver of the mixed layer may be deposited using cathodic arc technology by utilizing large area filtered arc deposition system. The filtered arc apparatus is configured to accommodate bearing components on a multi-position stage therein. A universal port is also provided in communication with a vacuum pump and gas supplies. In this manner, the port functions as a vacuum port and process gas inlet port. It is contemplated that a plurality of distinct ports may be provided for each of these functions. In operation of the apparatus, the large area filtered arc sources may be installed in a rectangular plasma guide chamber surrounded by rectangular deflecting coils. The filtered arc sources allow deposition of droplet free coatings by deflecting the plasma flow along curvilinear lines of force towards main chamber where substrates are located. The width of the plasma flow may be about 10 inches (23 cm) and the height may be about 12-18 inches (30-45 cm). The filtered arc sources can be operated in electron emission mode. Highly energetic electrons can be extracted from the filtered arc chamber to the main deposition chamber by energizing the auxiliary anode. This can be accomplished by turning off the deflecting magnetic field. The extracted electrons can be used to ionize the gas plasma in the deposition chamber. In this manner, a plasma envelop can be created which can completely surround the substrate material located in the main deposition chamber. Using this technique, very high ion current can be obtained as compared to other PVD techniques such as electron beam evaporation and magnetron sputtering. High ion currents can be utilized in very effective substrate cleaning through appropriate substrate biasing. Both RF and DC substrate biasing can be utilized.

In preparation for the coating process, cleaning steps may also be incorporated. Uncoated materials either in the form of a land region or bearing races commonly possess a passive oxide layer and/or grease/oil that needs to be cleaned thoroughly before depositing erosion resistant coatings. Hence, substrate cleaning procedures are preferably incorporated into the coating process. Oil/grease may be removed in an alkaline degrease step. Typical degreasers used are highly alkaline in nature and preferably used in ultrasonic baths for effective cleaning.

After this initial cleaning, metallic substrates 10 may be loaded in the deposition chamber. The coating chamber is evacuated to a base pressure of 8×10-3 pa. The samples may be heated in the range of 250 to 400° C. After heating the metallic substrates 1, they may be subjected to a plasma cleaning process employing Ar ion glow discharge. This is done to etch the surface to physically sputter out contaminants and make the surface atoms chemically active. Following surface cleaning, the substrates are ready for the deposition of the wear resistant coatings as described above.

Figure 2:
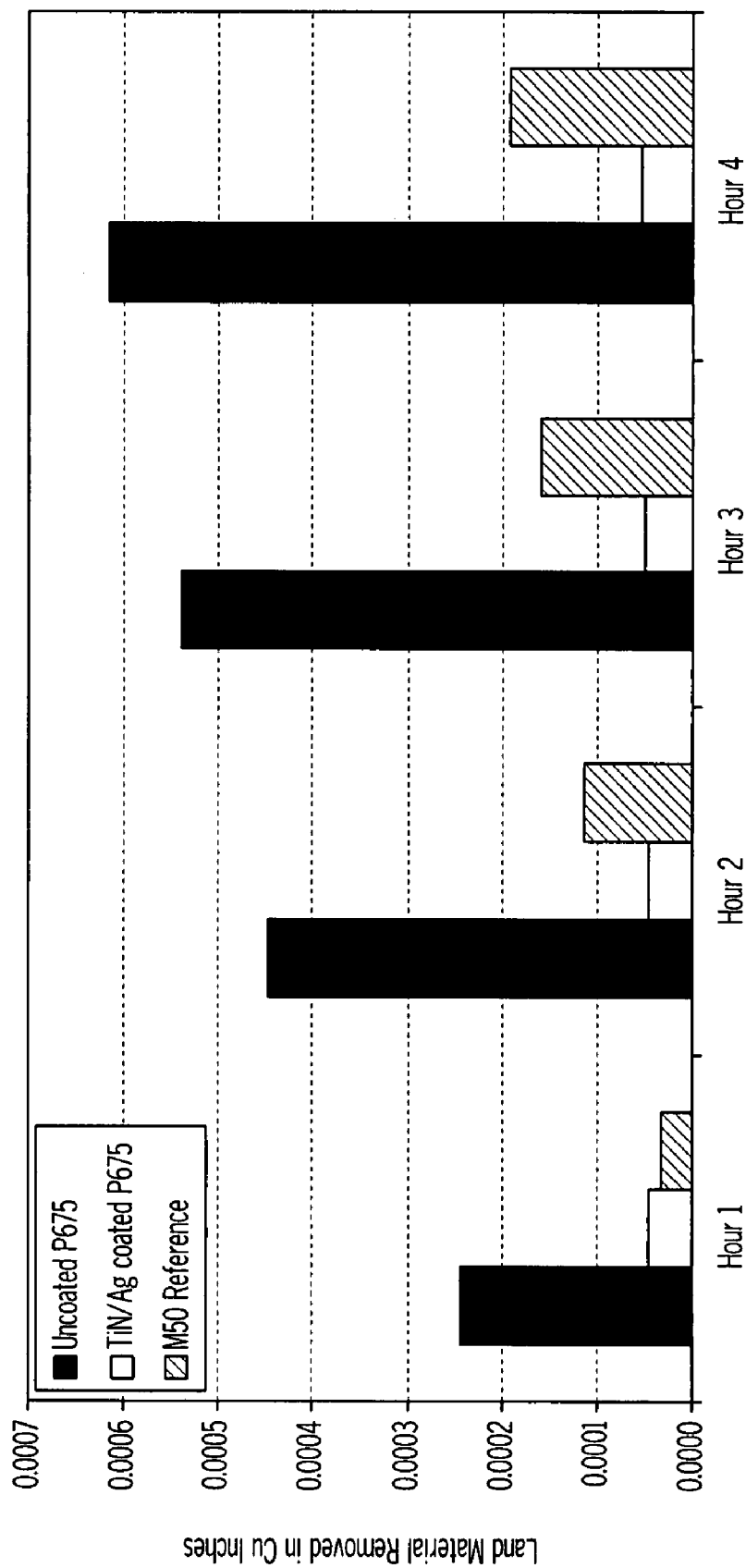
FIG. 2 is a graphical illustration comparing the wear of a substrate coated with the present TiN/Ag coating with the wear of conventional coated and uncoated substrates according to one or more embodiments of the present invention.

To test the strength of the coatings, simulated contaminated cage land wear tests on coated and uncoated metallic substrates (P 675 materials) were conducted. For comparison as shown in FIG. 2, the cage land wear test compared a land sample comprising bearing material (M50), a land sample comprising uncoated P 675 and the land sample coated with the TiN/Ag. In the cage land wear test, the cage material was 4340 steel coated with Ag. The lubricant used was MIL-PRF-7808L contaminated with 40 μm alumina ($Al_2O_3$). 200 mL of MIL-PRF-7808L oil was mixed with 1.32 gm of 40 μm alumina ($Al_2O_3$) to produce contaminated lubricant. Lube pump was set to 5.93 rpm and the cylinder (land) speed was 1802 rpm. The normal load used was 17.73 Newtons, which corresponds to initial Hertzian stress of ~11 KSi. The total test duration was 4 hours for each test.

Figure 3:
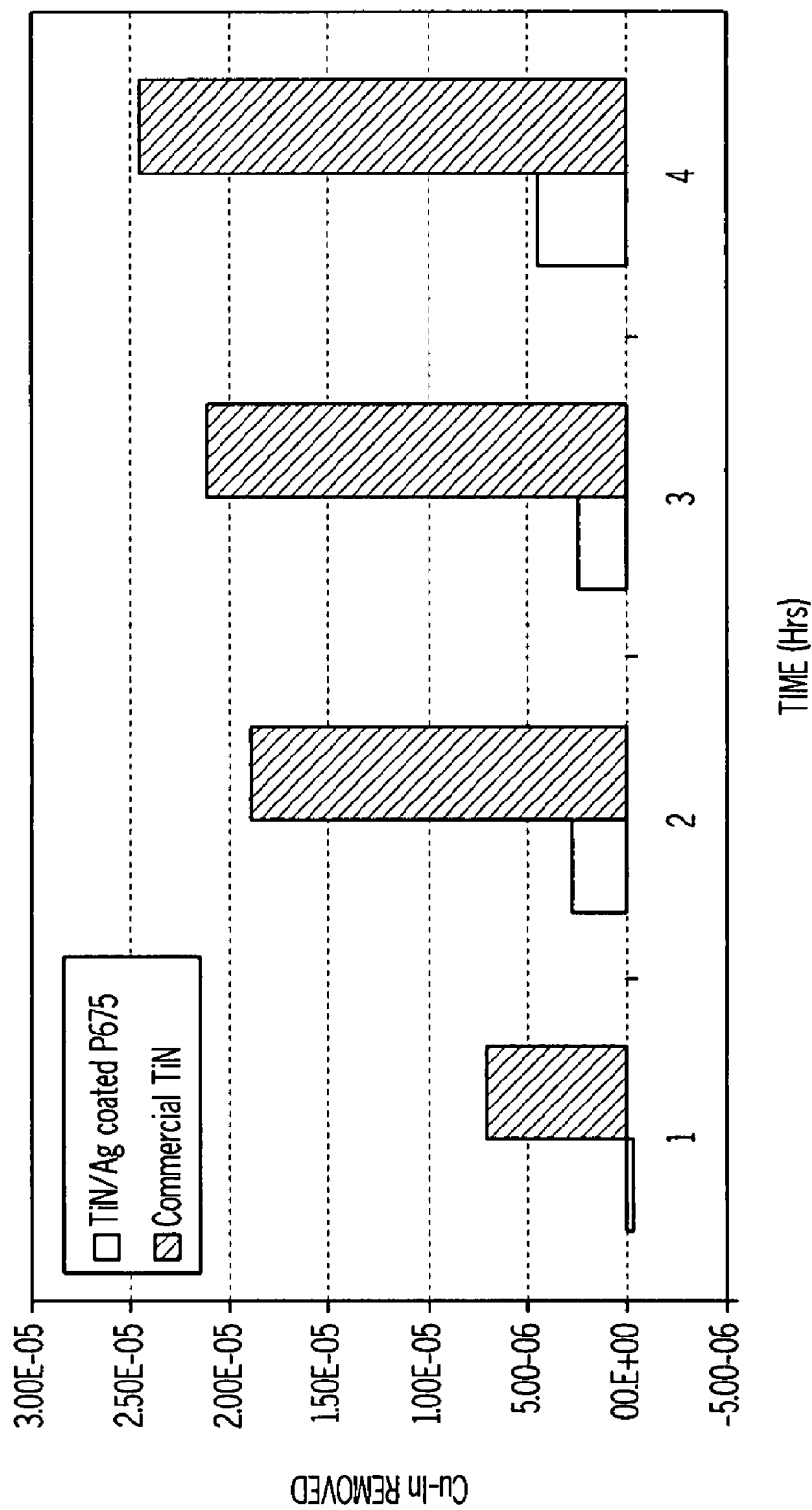
FIG. 3 is a graphical illustration comparing the wear of a substrate coated with the present TiN/Ag coating with the wear of a conventional coated substrate according to one or more embodiments of the present invention.

After completion of each hour, the wear on various land samples: uncoated P675; TiN/Ag coated P675; and M50 was measured by profilometry and shown in FIG. 2. The land wear observed on TiN/Ag coated Pyrowear 675 is three times lower than on uncoated (base line) Pyrowear 675. Similarly, the land wear on coated P675 samples is considerably lower than the land sample made from M50 bearing material. The wear data on the TiN/Ag coated P 675 land sample was also compared with that on the land sample coated with commercial titanium nitride coating. As shown in FIG. 3 the wear on the TiN/Ag coated sample was also found to be lower than that of a commercial TiN coated sample.

Figure 4:
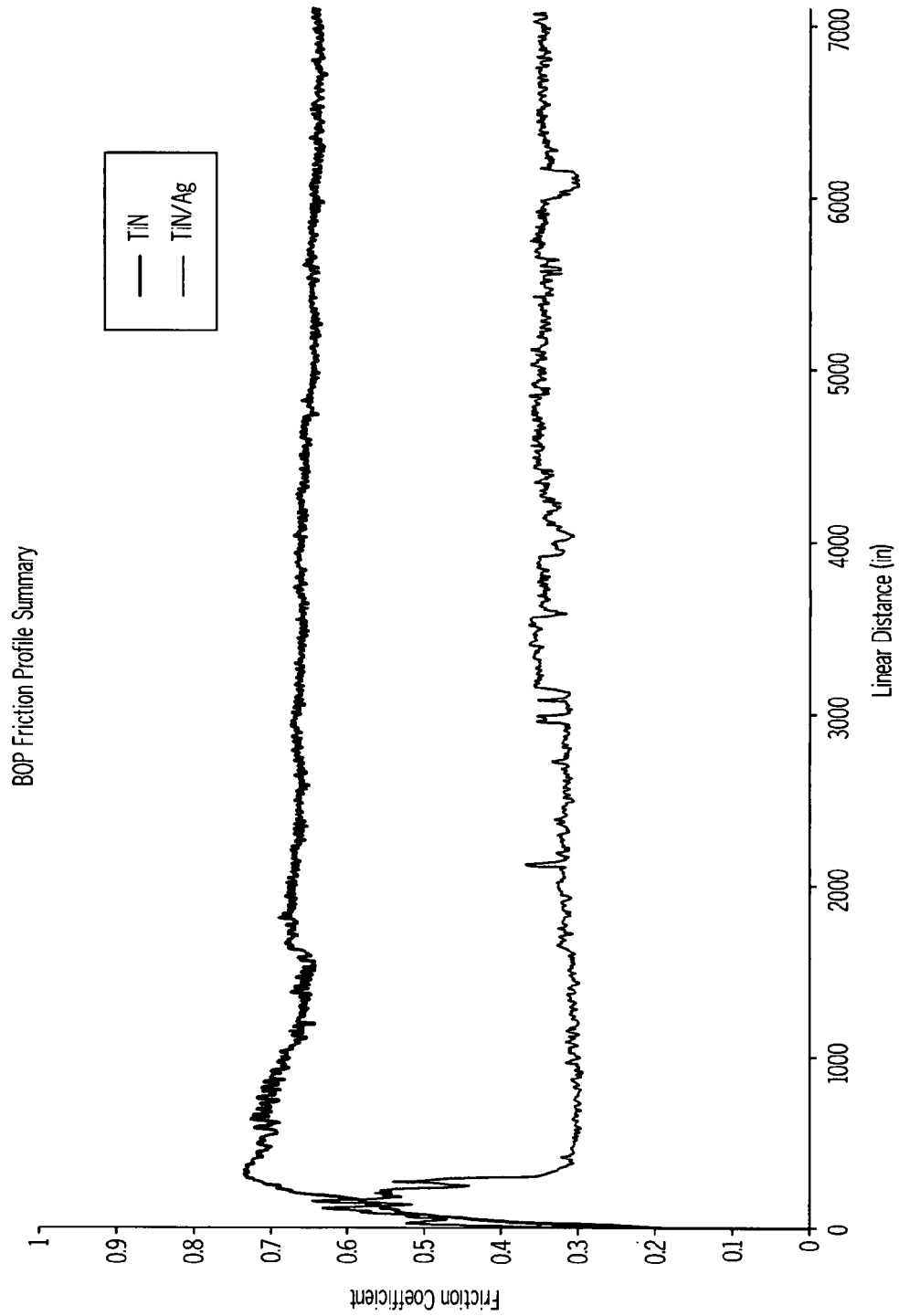
FIG. 4 is a graphical illustration comparing the friction profile of a substrate coated with the present TiN/Ag coating with the friction profile of a conventional coated substrate according to one or more embodiments of the present invention.

The friction profile of the TiN/Ag coated P 675 sample was compared with that on the conventional titanium coated P 675 sample in ball-on-plate test. As shown in FIG. 4 the friction coefficient of the TiN/Ag sample was found to be lower than that of the TiN coated sample. Moreover, nanohardness measurements of the composite TiN/Ag coating exhibited roughly 50% improvement over the conventional TiN coating.

It is noted that terms like "specifically," "preferably," "commonly," and "typically" are not utilized herein to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. It is also noted that terms like "substantially" and "about" are utilized herein to represent the inherent degree of uncertainty that may be attributed to any quantitative comparison, value, measurement, or other representation.

Having described the invention in detail and by reference to specific embodiments thereof, it will be apparent that modifications and variations are possible without departing from the scope of the invention defined in the appended claims. More specifically, although some aspects of the present invention are identified herein as preferred or particularly advantageous, it is contemplated that the present invention is not necessarily limited to these preferred aspects of the invention.

What is claimed is:

1. A coated substrate comprising:
   a metallic substrate;
   a ceramic underlayer comprising a nitride, a carbide, a carbonitride, a boride, or combinations thereof disposed over the metallic substrate;
   a mixed layer comprising titanium nitride and silver disposed over the metal underlayer, wherein the mixed layer comprises about 95.0 to about 99.0% by wt TiN and about 1.0 to about 5.0% by wt Ag; and
   a silver overlayer disposed over the mixed layer.

2. The coated substrate of claim 1 wherein the mixed layer comprises a thickness of about 0.5 to about 1.0 μm.

3. The coated substrate of claim 1 wherein the mixed layer is a composite nanocoating comprising particle sizes of about 10 to about 100 nm.

4. The coated substrate of claim 1 further comprising a metal layer disposed between the metallic substrate and the metal underlayer.

5. The coated substrate of claim 1 wherein the substrate comprises stainless steel.

6. The coated substrate of claim 1 wherein the ceramic underlayer comprises Ti, Cr, Al, Zr, Hf, Nb, V, or combinations thereof.

7. The coated substrate of claim 1 wherein the substrate is a race land region of a roller bearing.

8. A turbine bearing comprising the coated race land region of claim 7.

9. A coated substrate comprising:
   a stainless steel substrate;
   a titanium nitride underlayer disposed over the stainless steel substrate;
   a metal layer disposed between the stainless steel substrate and the titanium nitride underlayer;
   a mixed layer comprising titanium nitride and silver disposed over the titanium nitride underlayer; and
   a silver overlayer disposed over the mixed layer.

10. The coated substrate of claim 9 wherein the mixed layer comprises a thickness of about 0.5 to about 1.0 μm.

11. The coated substrate of claim 9 wherein the mixed layer is a composite nanocoating comprising particle sizes of about 10 to about 100 nm.

12. The coated substrate of claim 9 wherein the mixed layer comprises about 95.0 to about 99.0% by wt TiN and about 1.0 to about 5.0% by wt Ag.

13. A coated substrate comprising:
   a metallic substrate;
   a ceramic underlayer comprising a nitride, a carbide, a carbonitride, a boride, or combinations thereof disposed over the metallic substrate;
   a mixed layer comprising titanium nitride and silver disposed over the metal underlayer, wherein the mixed layer is a composite nanocoating comprising particle sizes of about 10 to about 100 nm; and
   a silver overlayer disposed over the mixed layer.

14. The coated substrate of claim 13 further comprising a metal layer disposed between the metallic substrate and the metal underlayer.

15. The coated substrate of claim 13 wherein the mixed layer comprises a thickness of about 0.5 to about 1.0 μm.

16. The coated substrate of claim 13 wherein the mixed layer comprises about 95.0 to about 99.0% by wt TiN and about 1.0 to about 5.0% by wt Ag.

17. The coated substrate of claim 13 wherein the substrate comprises stainless steel.

18. The coated substrate of claim 13 wherein the ceramic underlayer comprises Ti, Cr, Al, Zr, Hf, Nb, V, or combinations thereof.

19. The coated substrate of claim 13 wherein the substrate is a race land region of a roller bearing.

* * * * *